(12) United States Patent
Nanbu

(10) Patent No.: US 6,552,527 B1
(45) Date of Patent: Apr. 22, 2003

(54) WAFER MAP DISPLAY APPARATUS AND METHOD FOR SEMICONDUCTOR TEST SYSTEM

(75) Inventor: Mitsue Nanbu, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/711,704

(22) Filed: Nov. 13, 2000

(30) Foreign Application Priority Data

Nov. 12, 1999 (JP) ............................................. 11-008658
Jan. 13, 2000 (JP) ............................................. 12-010005

(51) Int. Cl.$^7$ ............................................... G01R 15/08
(52) U.S. Cl. ..................................... 324/158.1; 324/765
(58) Field of Search ............................... 324/158.1, 765, 324/121 R, 115; 382/145, 147; 702/58

(56) References Cited

U.S. PATENT DOCUMENTS

| | | | | |
|---|---|---|---|---|
| 3,204,144 A | * | 8/1965 | Deavenport ................. | 315/379 |
| 4,720,870 A | * | 1/1988 | Billiotte et al. ............. | 382/145 |
| 4,764,721 A | * | 8/1988 | Slavin ..................... | 324/121 R |
| 5,256,578 A | * | 10/1993 | Corley et al. ............. | 324/158.1 |
| 5,307,421 A | * | 4/1994 | Darboux et al. ............ | 382/145 |

* cited by examiner

*Primary Examiner*—Vinh P. Nguyen
(74) *Attorney, Agent, or Firm*—Muramatsu & Associates

(57) ABSTRACT

A wafer map display apparatus and method for displaying an entire image of a semiconductor wafer and IC chips therein with an optimal display size within a specified window size. The wafer map display apparatus acquires window size information for displaying a wafer map of a semiconductor wafer under test in a specified window, and calculates a chip display size every time when test results and XY address data of an IC chip that has been tested is received with use of all of XY address data of IC chips that have been tested, and renews the wafer map display based on the newest chip display size, thereby displaying all of the IC chips that have been tested and an overall semiconductor wafer under test with an optimum size within the specified window.

4 Claims, 5 Drawing Sheets

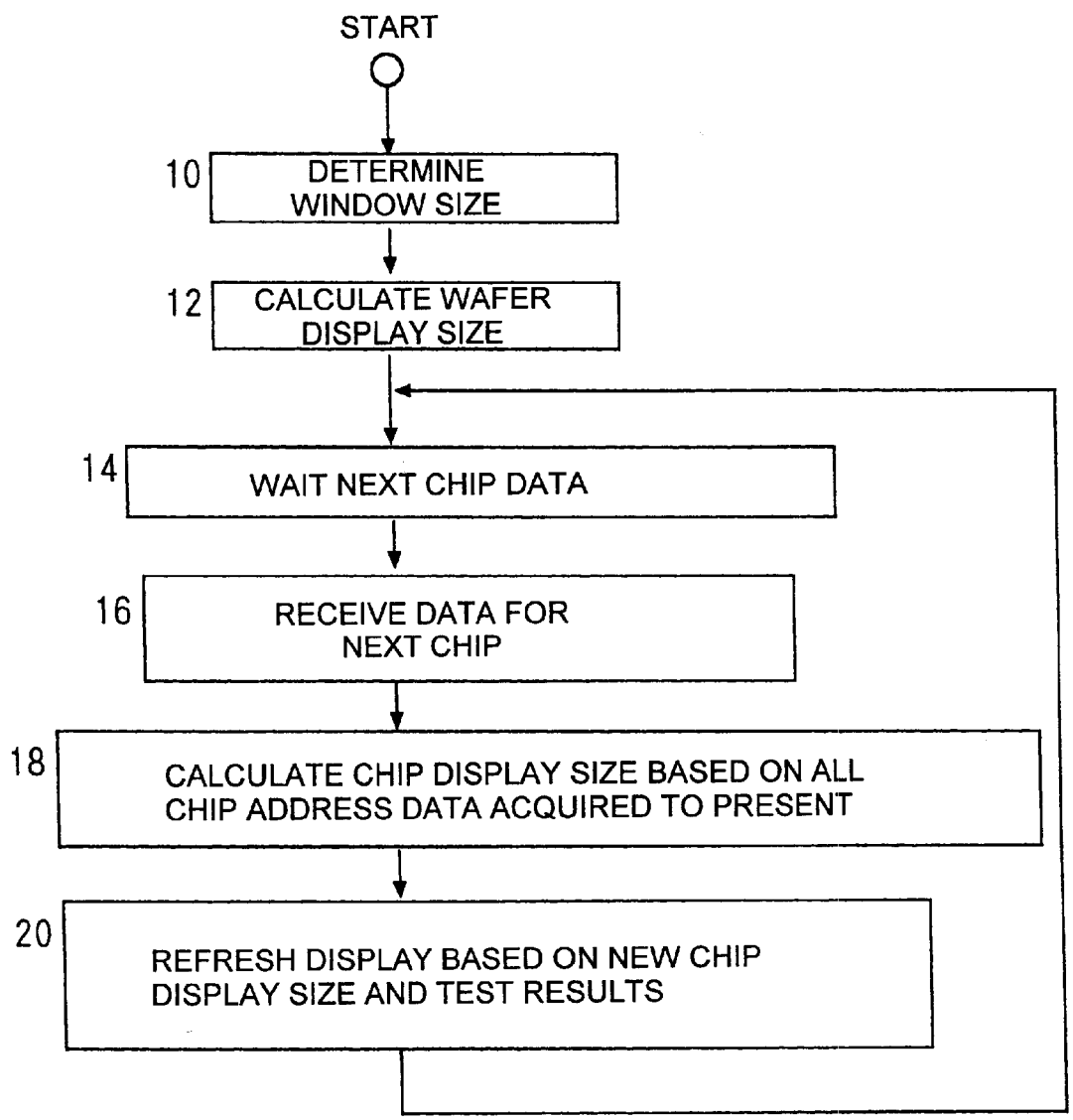

WAFER MAP DISPLAY APPARATUS AND METHOD FOR SEMICONDUCTOR TEST SYSTEM

FIELD OF THE INVENTION

This invention relates to a wafer map display apparatus and method for a semiconductor testing device, and more particularly, to a wafer map display apparatus and method which is capable of displaying an entire image of a semiconductor wafer and IC chips therein with an optimal display size within a specified window size even when there is no information available in advance on the number of IC chips or locations of the IC chips on the wafer.

BACKGROUND OF THE INVENTION

A wafer map display apparatus is used in a semiconductor test system for displaying an image of each IC chip on a semiconductor wafer as well as overall characteristics of the wafer for easily and accurately observing the test results. The wafer map display provides important information for evaluating a semiconductor wafer from the standpoint of production yield and quality assurance in a semiconductor production process.

Because a display monitor of a semiconductor test system is usually based on an operating system using "windows", such a wafer map display is also displayed on the display monitor in a manner similar to other application tools using windows. Therefore, a size of the window for displaying the wafer map is not fixed but frequently changed.

An example of conventional technology involved in such a wafer map display apparatus is explained below with reference to FIGS. 4 and 5. First, an entire structure of the semiconductor test system is shown in FIG. 4. In the example of FIG. 4, the system includes a test system main frame, a test station, a wafer prober, a work station WS, a wafer map display application, an input means (key board and mouse, etc.), a storage medium (floppy, hard or other memory disc), and a display device (monitor).

On a semiconductor wafer such as a silicon wafer, a plurality of IC chips to be tested are aligned in a matrix manner. The wafer prober is a handling device that can load, test, and unload semiconductor wafers one by one continuously in combination with the test station of the semiconductor test system. One or more IC chips are tested at the same time by connecting probe pins of the wafer prober to contact pads (electrodes) on the IC chips to establish electrical connection between the IC chips and the semiconductor test system for electrical communication therebetween for the purpose of testing the IC chips.

In the following description, it is assumed that each IC chip is tested one by one for illustration purpose. Thus, during the test, the test result for each IC chip and the X-Y address of the IC chip on the semiconductor wafer are obtained by the semiconductor test system one by one and sent to the work station WS.

The semiconductor test system that is composed of the test system main frame and the test station electronically communicates with the wafer prober through the test station, and tests the IC chips on the semiconductor wafer in a predetermined order. Every time when one IC chip is tested, the semiconductor test system sends the test result (pass/fail) information and category information of the particular IC chip to the work station WS, along with the chip address information of the IC chip on the semiconductor wafer through a communication network or line.

After receiving the test result information (which includes the chip address information on the wafer, pass/fail information in the test result, and the category information) from the semiconductor test system, the work station WS provides the received information to the wafer map display application. The received information is also stored in the storage medium.

The display device is a monitor which displays the test results and other information in a window format. It is rare for the display device used for the wafer map display of such a semiconductor test system that it is set to a single window such as shown in FIG. 5A. Rather, as shown in FIG. 5B, the wafer map display screen is shown on the display device along with other windows of other application tools. Therefore, the window size for the wafer map display varies depending on the size of the other window applications. Moreover, the user can change the window size of the wafer map display through an input means such as a mouse.

In the conventional wafer map display application, the display size for each IC chip is fixed. Because of this, the window size required for displaying an entire semiconductor wafer varies when displaying a wafer of different number of IC chips or a wafer having different XY address alignment of IC chips. An example of a manner of displaying each IC chip is a color display such as using green and red based on the pass/fail information or a color display based on the category information.

An example of wafer map displays in the conventional technology is shown in FIGS. 5A and 5B. First, in the example of large window size (window A) in FIG. 5A, it displays all of the IC chips within the window A. However, since the display size of each IC chip is fixed, even though the window A of FIG. 5A is large enough, the wafer map of the overall semiconductor wafer W is displayed much smaller than the size of the window A. Thus, the display example of FIG. 5A has a large portion of unused space, as shown by an area C. In other words, the overall semiconductor wafer is not displayed in the optimal size.

FIG. 5B shows another display example in the conventional technology in which the display monitor shows windows D, F and G of smaller sizes. The window D shows images of IC chips CH and the semiconductor wafer W wherein not all of the IC chips CH (or entire semiconductor wafer W) are displayed within the window D. Therefore, in this example, the test results of the entire semiconductor wafer is not observed in one screen, and the user has to use a pointing device such as a mouse to scroll the display. Moreover, in this conventional example, it is not possible to easily observe the manner of distribution of characteristics over the entire wafer.

As mentioned above, the conventional wafer map display technology has a drawback in which it is not able to display the IC chips in an optimal size because the chip display size is fixed. Moreover, although the window size required for displaying the entire wafer varies when displaying a wafer of different size, or a wafer of different number of chips or a wafer with different chip alignment, the wafer map display cannot adjust the overall display size of the wafer because the chip display size is fixed. Furthermore, when the window size that displays the wafer map is small, it is burdensome and inconvenient for the user to evaluate the wafer and chips since the entire wafer and all of the chips are not displayed on the monitor.

SUMMARY OF THE INVENTION

Therefore, it is an object of the present intention to provide a wafer map display apparatus and method that is capable of displaying an entire wafer image with an optimal chip display size depending on the number of chips and the XY address information of the chips on the semiconductor wafer relative to the window size in the wafer map display without causing a substantial unused area in the window.

It is another object of the present invention to provide a wafer map display apparatus and method which is capable of calculating and changing an optimal chip display size to display an image of all of the IC chips that have been tested and an overall image of the semiconductor wafer within the specified window size every time when the test result of each IC chip is received from the semiconductor test system.

It is a further object of the present invention to provide a wafer map display apparatus and method of improved test efficiency and accuracy by displaying an image of the IC chips that have been tested with a maximum available size within the specified window size every time when the test result of each IC chip is produced by the semiconductor test system.

To achieve the above objectives, the first aspect of the present invention is a wafer map display apparatus for a semiconductor test system for testing semiconductor devices by displaying an image of IC chips on a semiconductor wafer based on test results. The wafer map display apparatus includes means for acquiring window size information from a window managing system such as a work station for displaying a wafer map of a semiconductor wafer under test in a specified window, means for calculating a chip display size every time when XY address data of an IC chip that has been tested is received from the semiconductor test system with use of all of XY address data of IC chips acquired up to the present, and means for renewing the wafer map display based on the newest chip display size determined by the chip display size calculation means, thereby displaying all of the IC chips that have been tested and an overall semiconductor wafer under test with an optimum size within the specified window.

Preferably, the chip display size is calculated every time when the window size information from the window managing system is changed based on the XY address data of all of the IC chips that have been tested so that the images of the IC chips and the semiconductor wafer under test are displayed with a sufficiently large size or a maximum available size within the window size specified by the window managing system. Alternatively, the chip display size is determined based on the window size information from the window managing system and the chip display size obtained in the previous tests for the same kind of semiconductor wafer.

In the wafer map display apparatus, the semiconductor test system is able to test a plurality of semiconductor wafers in parallel at the same time and the window managing system provides window size information to the means for acquiring window size information for displaying a plurality of windows on the wafer map display apparatus, whereby displaying a plurality of windows each showing a set of IC chips and the semiconductor wafer corresponding to the specified size of the window.

Another aspect of the present invention is a semiconductor test system for testing semiconductor devices and displaying an image of IC chips on a semiconductor wafer based on test results. The semiconductor test system includes a wafer prober for loading, testing and unloading the semiconductor wafer under test in combination with a test station of the semiconductor test system, a display device for displaying an image of IC chips and a semiconductor wafer under test (wafer map display), a work station for controlling an overall operation of the semiconductor test system wherein the work station produces one or more windows on a screen of the display device, means for acquiring window size information from the work station for showing the wafer map display of the semiconductor wafer under test in a specified window on the display device, means for calculating a chip display size every time when XY address data of an IC chip that has been tested is received from the work station with use of all of XY address data of IC chips that have been tested acquired up to the present, and means for renewing the wafer map display based on the newest chip display size determined by the chip display size calculation means, thereby displaying an image of all of the IC chips that have been tested and the semiconductor wafer under test as a whole with an optimum size within the specified window.

A further aspect of the present invention is a method of displaying a wafer map which is an image of IC chips on a semiconductor wafer based on test results for a semiconductor test system for testing a semiconductor wafer. The method includes the steps of acquiring window size information from a window managing system for displaying the wafer map of a semiconductor wafer under test in a specified window, calculating a chip display size every time when XY address data of an IC chip that has been tested is received from the semiconductor test system with use of all of XY address data of all of IC chips that have been tested up to the present, and renewing the wafer map display based on the newest chip display size determined by the calculating step, thereby displaying all of the IC chips that have been tested and an overall semiconductor wafer under test with an optimum size within the specified window.

Preferably, the step of calculating the chip display size includes a process of calculating the chip display size every time when the window size information from the window managing system is changed based on the XY address data of all of the IC chips that have been tested so that the images of the IC chips and the semiconductor wafer under test are displayed with sufficiently large size within the window size specified by the window managing system.

Alternatively, the step of calculating the chip display size includes a process of determining the chip display size based on the window size information from the window managing system and the chip display size obtained in the previous test for the same kind of semiconductor wafer. When the chip display size is determined based on the previous test results of the other wafer, an IC chip is displayed with a size suitable for all of the IC chips on the semiconductor wafer can be displayed in one specified window even when the number of tested IC chips is substantially smaller than the overall number of IC chips on the semiconductor wafer under test.

According to the present invention, the wafer map display apparatus and method is capable of displaying the IC chips and semiconductor wafer with optimum size such as a maximum available size in the window even when the number of chips or XY chip address information is unknown in advance. The wafer map display apparatus and method of the present invention calculates the chip display size based on the test result information and displays the IC chips with colors and letters and the semiconductor wafer based on the calculated chip display size in an optimal size regardless of the number of IC chips within the window size. Therefore, the present invention substantially improves efficiency and accuracy of evaluating the IC chips and semiconductor wafers.

BRIEF DESCRIPTION OF THE DRAWINGS

FIG. 1 is a flow chart showing an example of operational procedure for displaying the wafer map which is adjusted to the window size in the present invention.

DETAILED DESCRIPTION OF THE PREFERRED EMBODIMENT

Figure 2A:
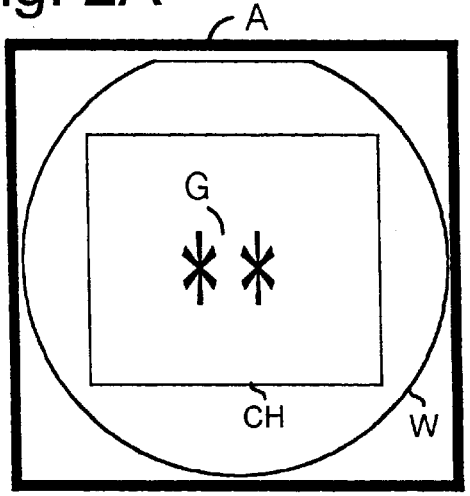
FIGS. 2A–2F are diagrams showing examples of wafer map display with an optimal chip display size in a step-by-step manner in accordance with the present invention.
Figure 2B:
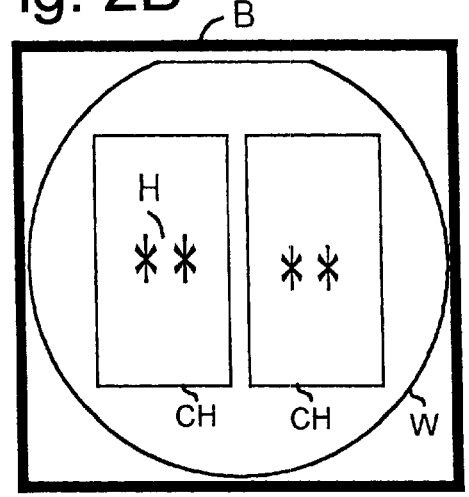
Figure 2C:
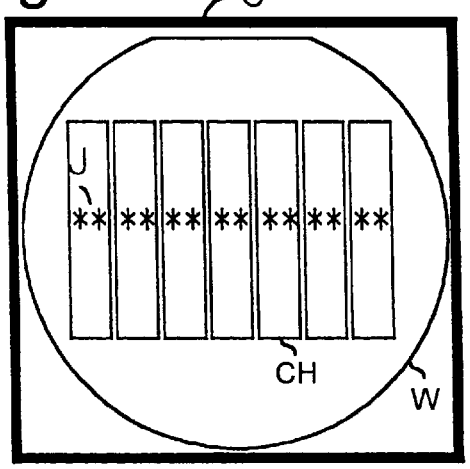
Figure 2D:
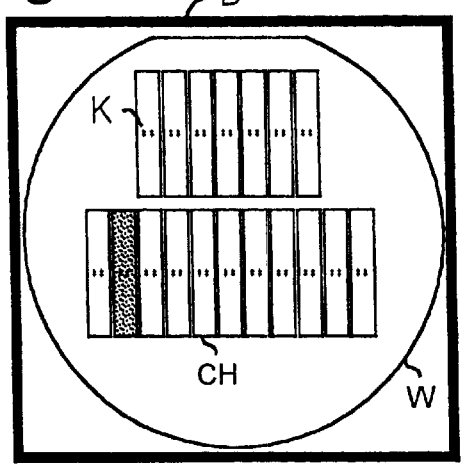
Figure 2E:
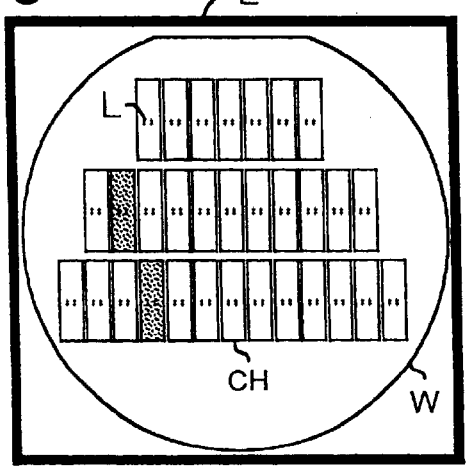
Figure 2F:
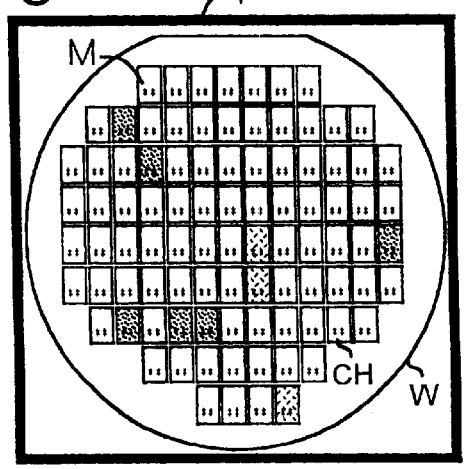
Figure 3:
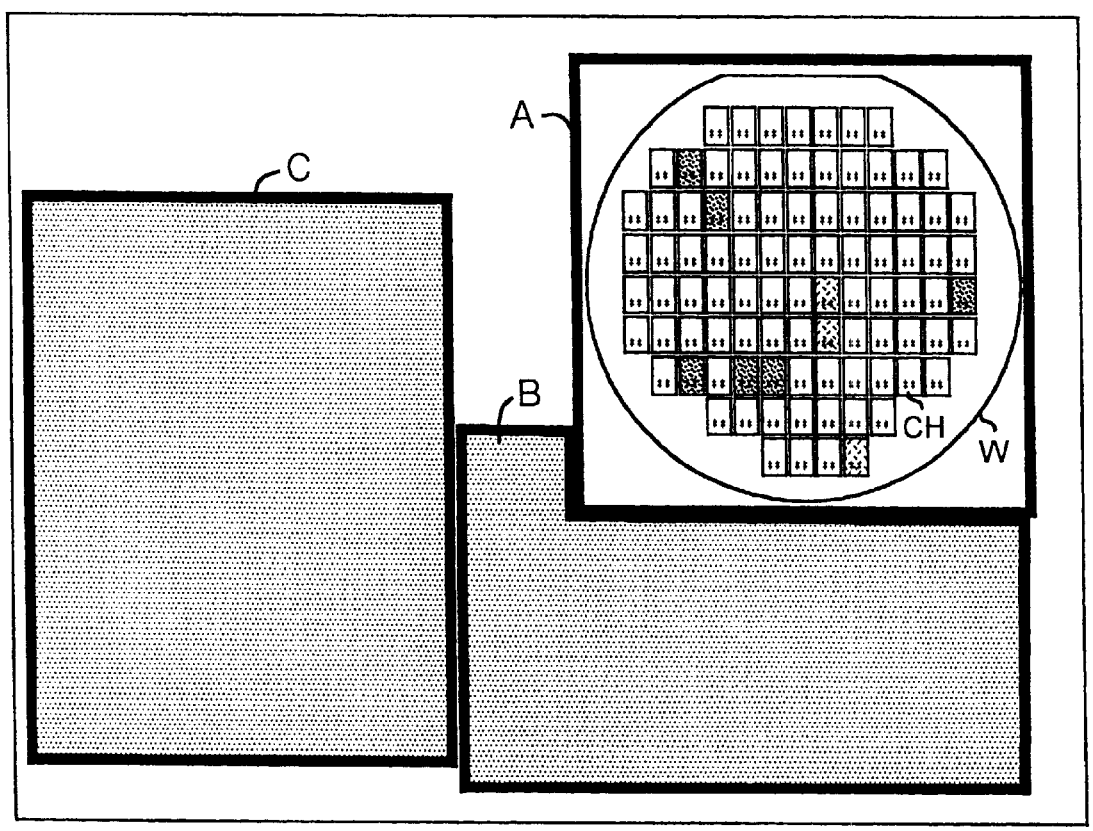
FIG. 3 is a diagram showing an example of wafer map display with a plurality of windows of small size in which an entire semiconductor wafer is displayed in one of the windows.
Figure 4:
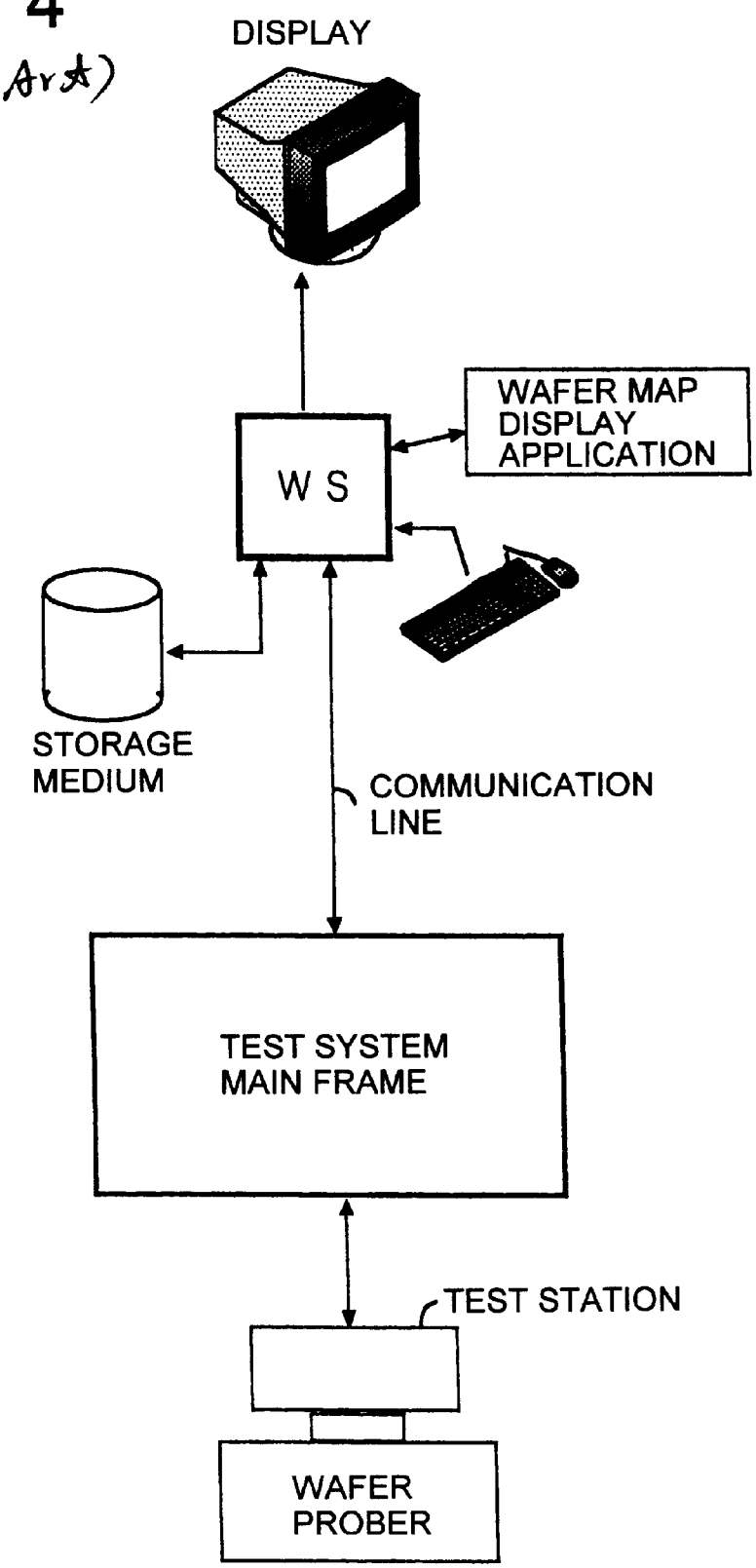
FIG. 4 is a schematic diagram showing an example of semiconductor test system including a work station and a display device where a test station and a wafer prober are connected with one another.
Figure 5A:
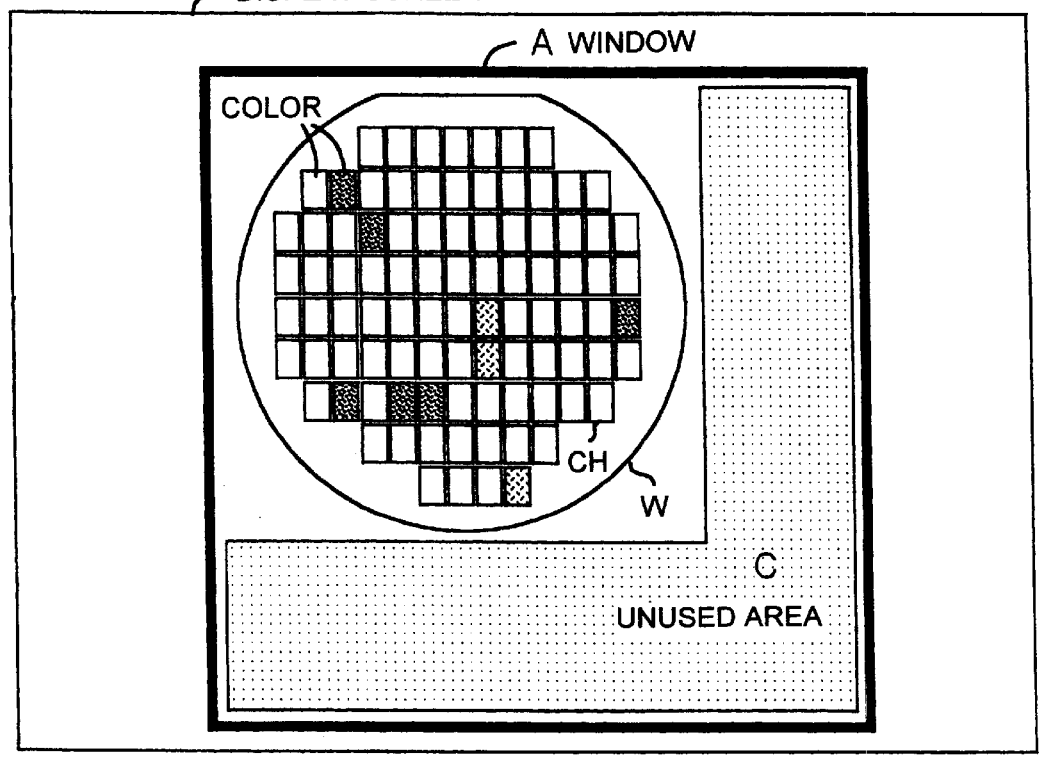
FIGS. 5A and 5B are diagrams showing an example of wafer map display with different sizes of window in the conventional technology.
Figure 5B:
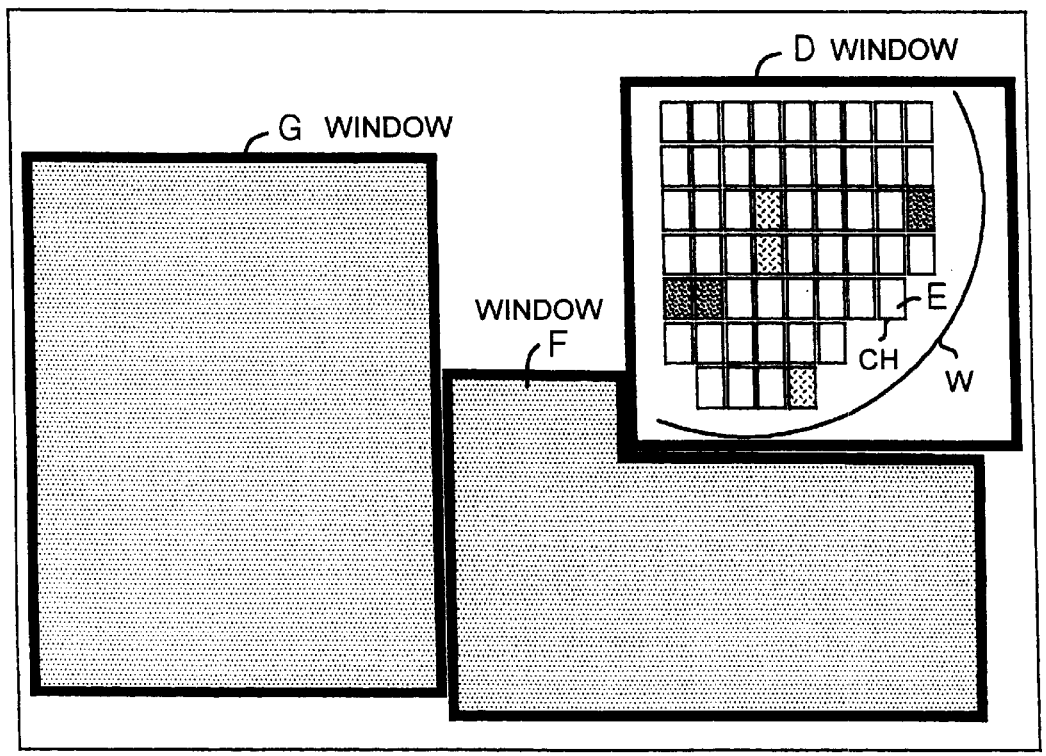

Preferred embodiments of the present invention will be described in the following with reference to the accompanying drawings. The embodiments of the present invention are shown in FIGS. 1–3 wherein FIG. 1 is a flow chart showing an example of operational procedure for displaying the wafer map which is adjusted to the window size, FIGS. 2A–2E show examples of wafer map display with an optimal chip display size for different number of chips, FIG. 3 shows an example of wafer map display with a plurality of windows of small size in which an entire semiconductor wafer is displayed in one of the windows.

The operational process of the present invention is explained with reference to the flow chart of FIG. 1 and the display examples of FIGS. 2A–2E. Here, it is assumed that test result information of an IC chip is transferred from the semiconductor test system to the work station WS each time when the test result is obtained for one IC chip. It is also assumed that the number of chips in the entire semiconductor wafer and the XY alignment (XY address) of the chips in the semiconductor wafer are not known in advance. Since the number of chips that are to be displayed in the window on the display monitor and the locations of the chip are unknown to the wafer map display application, the chip display size is also undefined at the start of the wafer map display process.

In the procedure of FIG. 1, the size of the window is determined in the step 10. Namely, the process retrieves the window size information from the window management system of the work station WS. In the step 12, the wafer map display process calculates the wafer display size to determine the overall size of the semiconductor wafer to be fit to the window based on the window size information obtained in the step 10. Thus, the overall shape of the semiconductor wafer is displayed with the maximum size within the specified window. Further, one or more IC chips are displayed within the image of this semiconductor wafer.

In the step 14, the process waits for the information concerning the next IC chip from the semiconductor test system. Typically, such a waiting time is from several seconds to several minutes during which the semiconductor test system supplies test signals to the IC chip and evaluates the response output signals of the IC chip. During this waiting period, if necessary, the wafer map display process may retrieve the window size information again and if the window size is changed, the new wafer size will be determined by the process same or similar to the step 12.

In the step 16, the wafer map display process retrieves chip information regarding one IC chip on the semiconductor wafer from the test system through the work station WS. Such chip information includes the test result (pass/fail and test category and fail category and the like) and the chip address (XY address on the semiconductor wafer) information of the IC chip that has been tested.

Then the process determines a chip display size by using all of the chip XY address information received by that time in such a way that all of the chips that have been tested can be displayed with a sufficiently large size, preferably with a maximum available size, within the specified window size. According to this procedure, the first IC chip is displayed with the maximum display size as shown in FIG. 2A. When the second IC chip has been tested, the chip display size is decreased so that two IC chips are displayed with sufficiently large (or maximum available) size within the window. In this manner, depending on the number of IC chips that have been tested, the chip display size decreases accordingly. Thus, as more chips are tested and the test results are received by the wafer map display process, the chip display size is decreased as shown in FIGS. 2B–2E.

In the step 20, the process refreshes all of the display with the new display based on the test result including the category information that have been acquired up to the present corresponding to the locations in the wafer defined by the XY address data of the IC chips. Such test results may be displayed with use of colors or characters for illustrating the "pass/fail" and/or "fail and test category" such as shown in FIGS. 2A–2E.

According to the procedure of FIGS. 1 and 2 above, the semiconductor wafer with all of the IC chips tested so far can be displayed with the maximum size available for the window size without causing an unused area in the window. Thus, as shown in FIG. 3, even with a rather small window size, all of the IC chips that have been tested can be displayed within the specified window size. Further as shown in FIG. 3, the wafer map display with an optimal size can be displayed corresponding to the window size.

An actual implementation of the present invention is not limited to the aforementioned example and can be implemented in a modified manner. For example, IC chips under the mass production may involve the same wafer size, same number of chips on the wafer and the same XY addresses on the wafer. Thus, when this information is known in advance, the same display data such as the chip display size data obtained concerning the previous semiconductor wafer can be used for displaying the wafer map display for the remaining wafer and chips. Further, since the number of chips and the addresses are known, even when only the first chip has been tested, such a test result can be displayed in the manner and size of FIG. 2E, thereby achieving an image of actual relationship between the IC chips and semiconductor wafer.

Moreover, when receiving the test result information for all of the IC chips on the wafer stored in the storage medium, rather than one by one, the positional information for all of the IC chips are ready at the first stage of displaying the wafer map display. Therefore, even when displaying only the first IC chip on the wafer, the first IC chip can be displayed with the final chip display size of FIG. 2E, thereby achieving an image of actual relationship between the IC chips and semiconductor wafer.

Furthermore, in the case where two or more wafer probers are used and thus IC chips on two or more wafers are tested in parallel at the same time, the wafer map display of the present invention can display two or more windows corresponding to the number of wafers to display the IC ships and wafers in the corresponding windows with optimum sizes at the same time.

As has been foregoing, the wafer map display apparatus and method of the present invention is capable of displaying the IC chips and semiconductor wafer with optimum size in the window even when the number of chips or XY chip address information is unknown in advance. The wafer map display apparatus and method of the present invention calculates the chip display size based on the test result information and displays the IC chips with letters and the semiconductor wafer based on the calculated chip display size in an optimal size regardless the number of IC chips within the window size. Therefore, the present invention substantially improves efficiency and accuracy of evaluating the IC chips and semiconductor wafers.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A method of displaying a wafer map which is an image of IC chips on a semiconductor wafer based on test results from a semiconductor test system controlled by a workstation, comprising the following steps of:

acquiring window size information from a window managing system in the workstation for displaying the wafer map of a semiconductor wafer under test in a specified window of a display screen;

calculating a chip display size every time when XY address data of an IC chip that has been tested is received from the semiconductor test system with use of all of XY address data of all of IC chips that have been tested up to present and the window size information; and renewing the wafer map display based on the newest chip display size determined by the step of calculating the chip display size, thereby displaying all of the IC chips that have been tested and an overall semiconductor wafer under test with a maximum available size within the specified window.

2. A method of displaying a wafer map as defined in claim 1, wherein the step of calculating the chip display size includes a process of calculating the chip display size every time when the window size information from the window managing system is changed based on the XY address data of all of the IC chips that have been tested so that the images of the IC chips and the semiconductor wafer under test are displayed on the display screen with maximum sizes within the window size specified by the window managing system.

3. A method of displaying a wafer map as defined in claim 1 wherein the step of calculating the chip display size includes a process of determining the chip display size based on the window size information from the window managing system and the chip display size obtained in previous tests conducted on the same kind of semiconductor wafer.

4. A method of displaying a wafer map as defined in claim 1, wherein an IC chip is displayed with a size that would be suitable for displaying all of the IC chips on the semiconductor wafer in one specified window even when the number of tested IC chips is substantially smaller than that of all of IC chips on the semiconductor wafer under test.

* * * * *